US007935923B2

(12) United States Patent
Cheung et al.

(10) Patent No.: US 7,935,923 B2
(45) Date of Patent: May 3, 2011

(54) PERFORMANCE ENHANCEMENT THROUGH USE OF HIGHER STABILITY REGIONS AND SIGNAL PROCESSING IN NON-IDEAL QUADRUPOLE MASS FILTERS

(75) Inventors: Kerry Cheung, Cambridge, MA (US); Luis F. Velásquez-García, Boston, MA (US); Akintunde I. Akinwande, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 346 days.

(21) Appl. No.: 12/168,407

(22) Filed: Jul. 7, 2008

(65) Prior Publication Data

US 2009/0026363 A1 Jan. 29, 2009

Related U.S. Application Data

(60) Provisional application No. 60/948,224, filed on Jul. 6, 2007, provisional application No. 60/948,221, filed on Jul. 6, 2007.

(51) Int. Cl.
*H01J 37/12* (2006.01)

(52) U.S. Cl. .................................... 250/292; 250/396 R

(58) Field of Classification Search .................. 250/292, 250/290, 396 R, 281, 282

See application file for complete search history.

(56) References Cited

U.S. PATENT DOCUMENTS 6,075,244 A * 6/2000 Baba et al. .................... 250/292
6,403,955 B1 6/2002 Senko
6,441,370 B1 8/2002 Khosla et al.
6,465,792 B1 * 10/2002 Baptist ...................... 250/396 R
6,784,424 B1 8/2004 Willoughby et al.
6,797,950 B2 9/2004 Schwartz et al.
6,844,547 B2 * 1/2005 Syka ............................ 250/292
6,870,158 B1 3/2005 Blain
6,891,157 B2 5/2005 Bateman et al.
7,045,797 B2 * 5/2006 Sudakov et al. .............. 250/292
7,208,729 B2 * 4/2007 Syms ............................ 250/288

FOREIGN PATENT DOCUMENTS

SU 1396174 5/1988
SU 1758706 8/1992

OTHER PUBLICATIONS

Konenkov et al., "Quadrupole mass filter operation with auxiliary quadrupolar excitation: theory and experiment" International Journal of Mass Spectrometry, 208 (2001), XP007908973, pp. 17-27.
Konenkov et al., "Upper Stability Island of the Quadrupole Mass Filter with Amplitude Modulation of the Applied Voltages" 2005 American Society for Mass Spectrometry, pp. 379-387.

* cited by examiner

*Primary Examiner* — Kiet T Nguyen
(74) *Attorney, Agent, or Firm* — Gauthier & Connors LLP

(57) ABSTRACT

A quadrupole mass filter (QMF) is provided. The QMF includes a plurality of rectangular shaped electrodes aligned in a symmetric manner to generate a quadrupole field. An aperture region is positioned in a center region parallel to and adjacent to each of the rectangular shaped electrodes. An incoming ion stream enters the aperture region so as to be controlled by the quadrupole field. A plurality of voltage sources provide a r.f. and d.c. signal to the electrodes for generating the quadrupole field. An auxiliary voltage source applies an auxiliary drive signal to the r.f. and d.c. signal to create new stability boundaries within the standard Mathieu stability regions with high-resolution around operating conditions where there are approximately no higher-order resonances.

21 Claims, 12 Drawing Sheets

PERFORMANCE ENHANCEMENT THROUGH USE OF HIGHER STABILITY REGIONS AND SIGNAL PROCESSING IN NON-IDEAL QUADRUPOLE MASS FILTERS

PRIORITY INFORMATION

This application claims priority from provisional application Ser. Nos. 60/948,221 and 60/948,224 filed Jul. 6, 2007, both of which are incorporated herein by reference in their entireties.

This invention was made with government support awarded by the Defense Advanced Research Projects Agency (DARPA) under Contract No. W911QY-05-1-000. The government has certain rights in the invention.

BACKGROUND OF THE INVENTION

The invention relates to the field of MEMS quadrupoles, and in particular to the operational conditions to improve the performance of a rectangular rod, planar MEMS quadrupoles with ion optics.

In recent years, there has been a desire to scale down linear quadrupoles. The key advantages of this miniaturization are the portability it enables, and the reduction of pump-power needed due to the relaxation on operational pressure. Attempts at making linear quadrupoles on the micro-scale were met with varying degrees of success. Producing these devices required some combination of microfabrication and/or precision machining, and tedious downstream assembly. For miniature quadrupole mass filters to be mass-produced cheaply and efficiently, manual assembly should be removed from the process.

SUMMARY OF THE INVENTION

According to one aspect of the invention, there is provided a quadrupole mass filter (QMF). The QMF includes a plurality of rectangular shaped electrodes aligned in a symmetric manner to generate a quadrupole field. An aperture region is positioned in a center region parallel to and adjacent to each of the rectangular shaped electrodes. An incoming ion stream enters the aperture region so as to be controlled by the quadrupole field. A plurality of voltage sources provide a r.f. and d.c signal to the electrodes for generating the quadrupole field. An auxiliary voltage source applies an auxiliary drive signal to the r.f. and d.c. signal to create new stability boundaries within the standard Mathieu stability regions with high-resolution around operating conditions where there are approximately no higher-order resonances.

According to another aspect of the invention, there is provided a method of forming a quadrupole mass filter (QMF). The method includes forming a plurality of rectangular shaped electrodes aligned in a symmetric manner to generate a quadrupole field. Also, the method includes forming an aperture region positioned in a center region parallel to and adjacent to each of the rectangular shaped electrodes. An incoming ion stream enters the aperture region so as to be controlled by the quadrupole field. In addition, the method includes a plurality of voltage sources that provide a r.f. and d.c. signal to the electrodes for generating the quadrupole field. Furthermore, the method includes providing an auxiliary voltage source that applies an auxiliary drive signal to the r.f. and d.c. signal to create new stability boundaries within the standard Mathieu stability regions with high-resolution around operating conditions where there are approximately no higher-order resonances.

According to another aspect of the invention, there is provided a method of forming a quadrupole field. The method includes aligning a plurality of rectangular shaped electrodes in a symmetric manner to generate a quadrupole field. Also, the method includes positioning an aperture region in a center region parallel to and adjacent to each of the rectangular shaped electrodes. An incoming ion stream enters the aperture region so as to be controlled by the quadrupole field. In addition, the method includes providing a r.f. and d.c. signal to the electrodes for generating the quadrupole field. Furthermore, the method includes applying an auxiliary drive signal to the r.f. and d.c. signal to create new stability boundaries within the standard Mathieu stability regions with high-resolution around operating conditions where there are approximately no higher-order resonances.

DETAILED DESCRIPTION OF THE INVENTION

The invention involves a purely microfabricated quadrupole mass filter (QMF) comprising of a planar design and a rectangular electrode geometry. Quadrupole resolution is proportional to the square of the electrode length, thus favoring a planar design since electrodes can be made quite long. Rectangular rods are considered since that is the most amenable geometric shaped for planar microfabrication. This deviation from the conventional round rod geometry calls for optimization and analysis.

Figure 1:
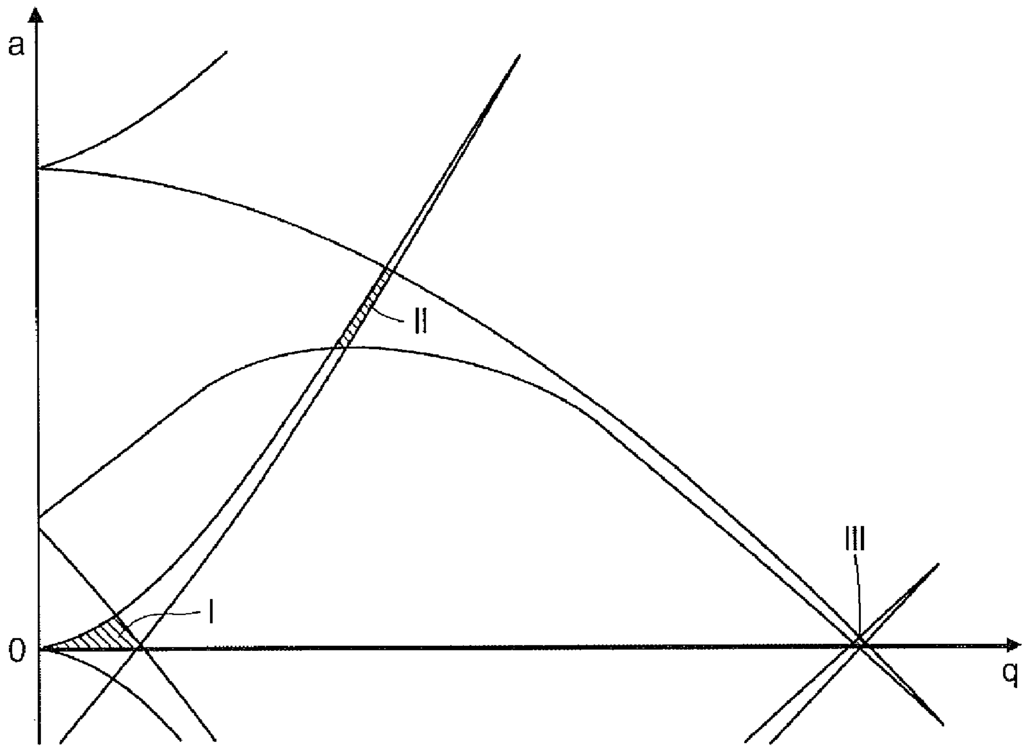
FIG. 1 is a Mathieu stability diagram showing quadrupole stability regions I, II, and III.

The inventive QMF utilizes four rectangular electrodes aligned in a symmetric manner to generate a quadrupole field. If the applied potential is a combination of r.f. and d.c. voltages, the equations of motion for a charged ion in this field would be given by the Mathieu equation. This equation has stable and unstable solutions that can be mapped as a function of two parameters. Overlapping the Mathieu stability diagrams for the directions orthogonal to the quadrupole axis define stability regions, shaded areas in FIG. 1, where ion motion is stable in both directions.

Most commercial QMFs and reported MEMS-based versions utilize cylindrical electrodes instead of hyperbolic ones due to the reduced complexity in manufacturing. To compensate for the distortion that comes from using non-hyperbolic electrodes, optimization was conducted to minimize the higher-order field components that are a result of this non-ideality. Optimization can be conducted on the rectangular electrodes of the inventive QMF to minimize unwanted field components as well.

Figure 2:
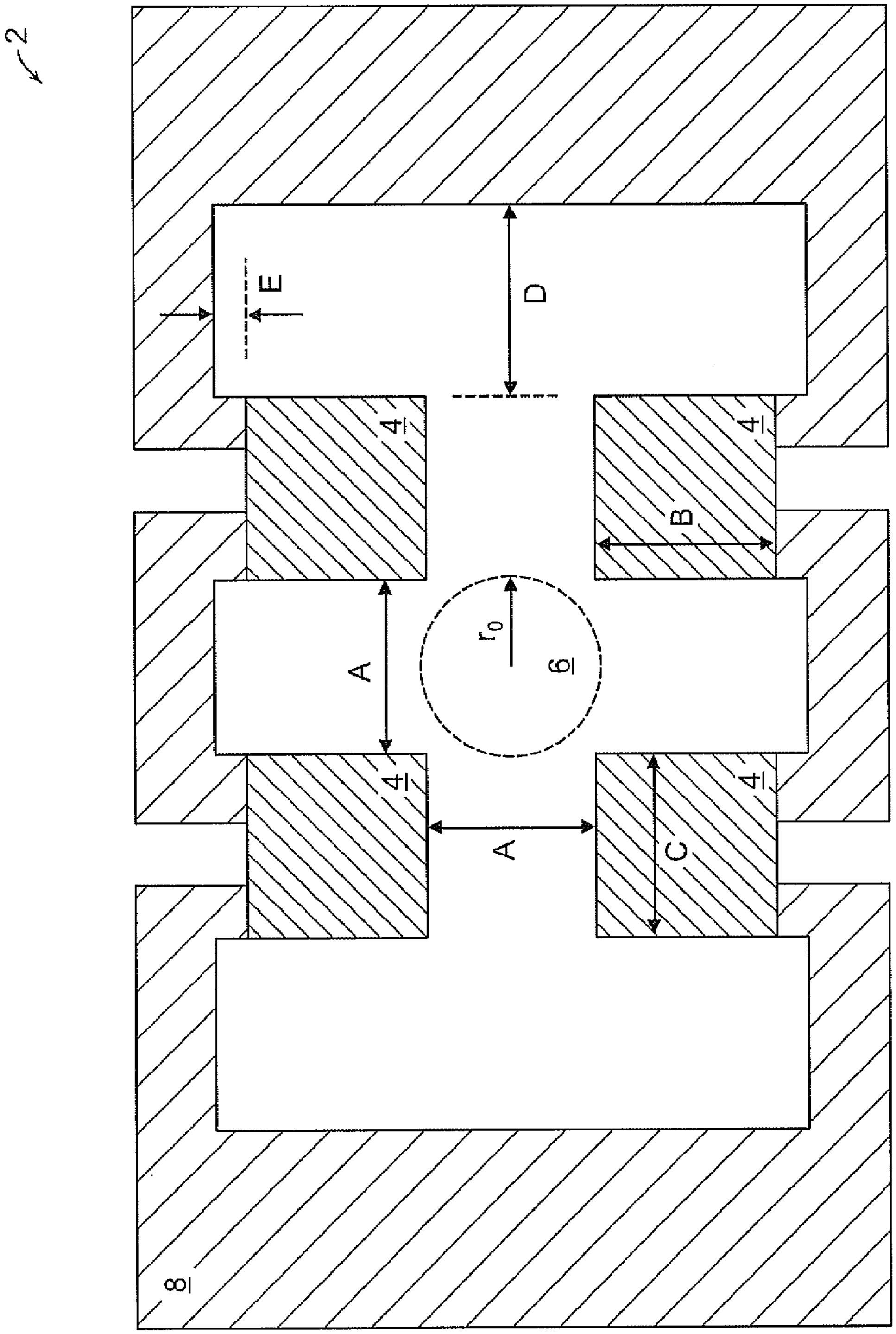
FIG. 2 is a schematic diagram of the inventive quadrupole mass filter cross-section.

FIG. 2 shows the cross-section of an inventive quadrupole mass filter 2. The quadrupole mass filter 2 includes four rectangular electrodes 4, aperture 6, and a housing unit 8. The rectangular electrodes 4 are aligned in a symmetric manner to generate and a quadrupole field. The aperture 6 is positioned in a center region parallel to and adjacent to each of the rectangular shaped electrodes 4, and allows an incoming ion stream to pass so as to be controlled by the quadrupole field. The rectangular electrodes 4 have a height B and width C. The aperture 6 includes a circular region having a radius $r_0$ that is adjacent to the electrodes. The rectangular electrodes 4 are separated by a distance A and distances from the rectangular electrode surfaces to the surrounding housing are D and E.

Maximum transmission through a QMF occurs when the incoming ions enter near the aperture 6 of the QMF 2. The inclusion of integrated ion optics can help focus the ion stream towards the aperture 6, as well as control the inlet and outlet conditions, thus improving overall performance.

Maxwell 2D is used to calculate the potentials for the various geometries. The field solutions are exported into a MATLAB script that decomposed the field into equivalent multipole terms. $C_2$ is the coefficient corresponding to an ideal quadrupole field, while $S_4$ and $C_6$ are the first odd and even higher-order component respectively. This expansion is used to examine the magnitudes of the higher-order components as a function of device geometry and is summarized in FIG. 3.

Figure 3A:
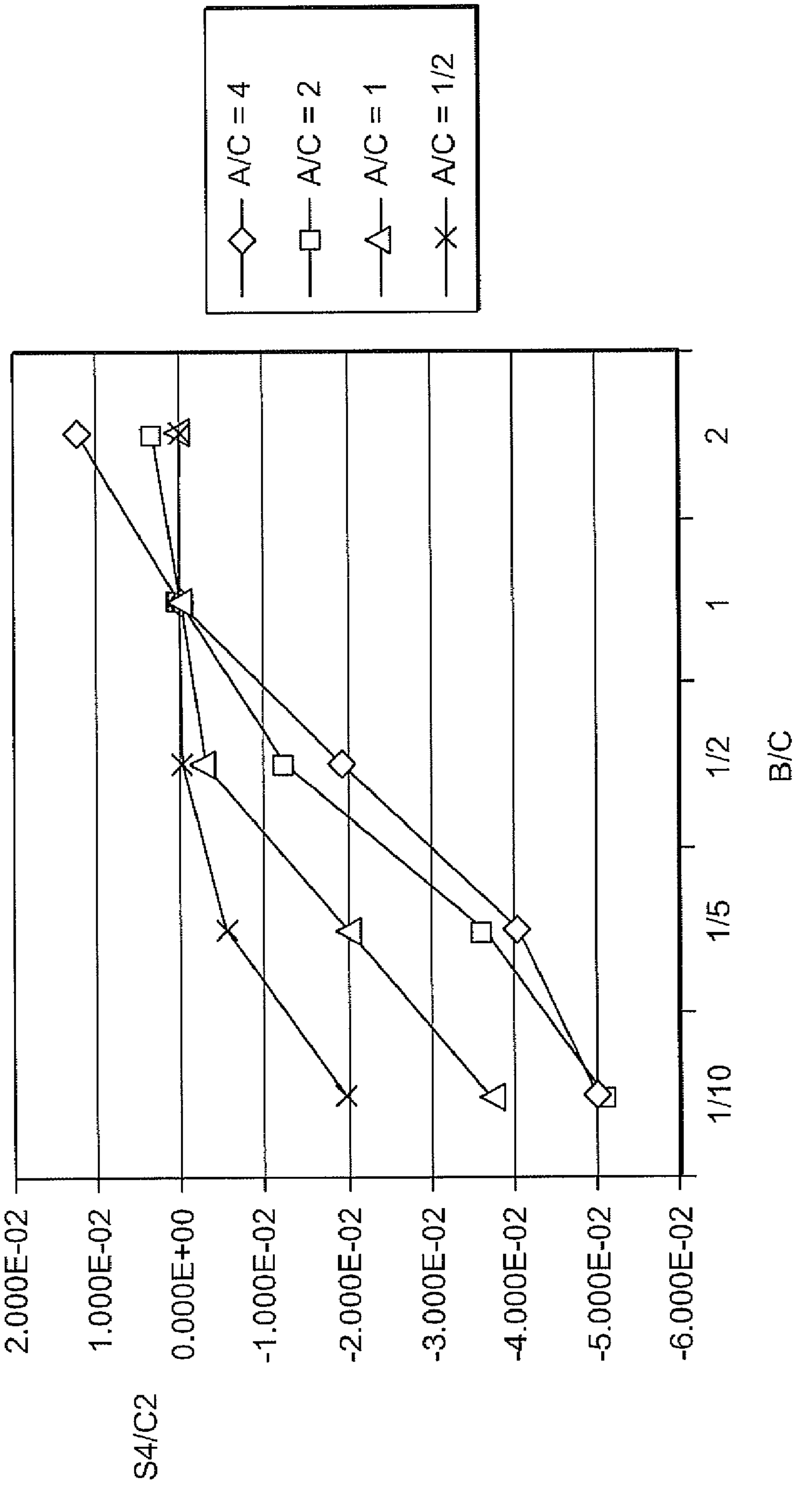
FIGS. 3A-3D are graphs illustrating the expansion used to examine the magnitudes of the higher-order components as a function of device geometry.
Figure 3B:
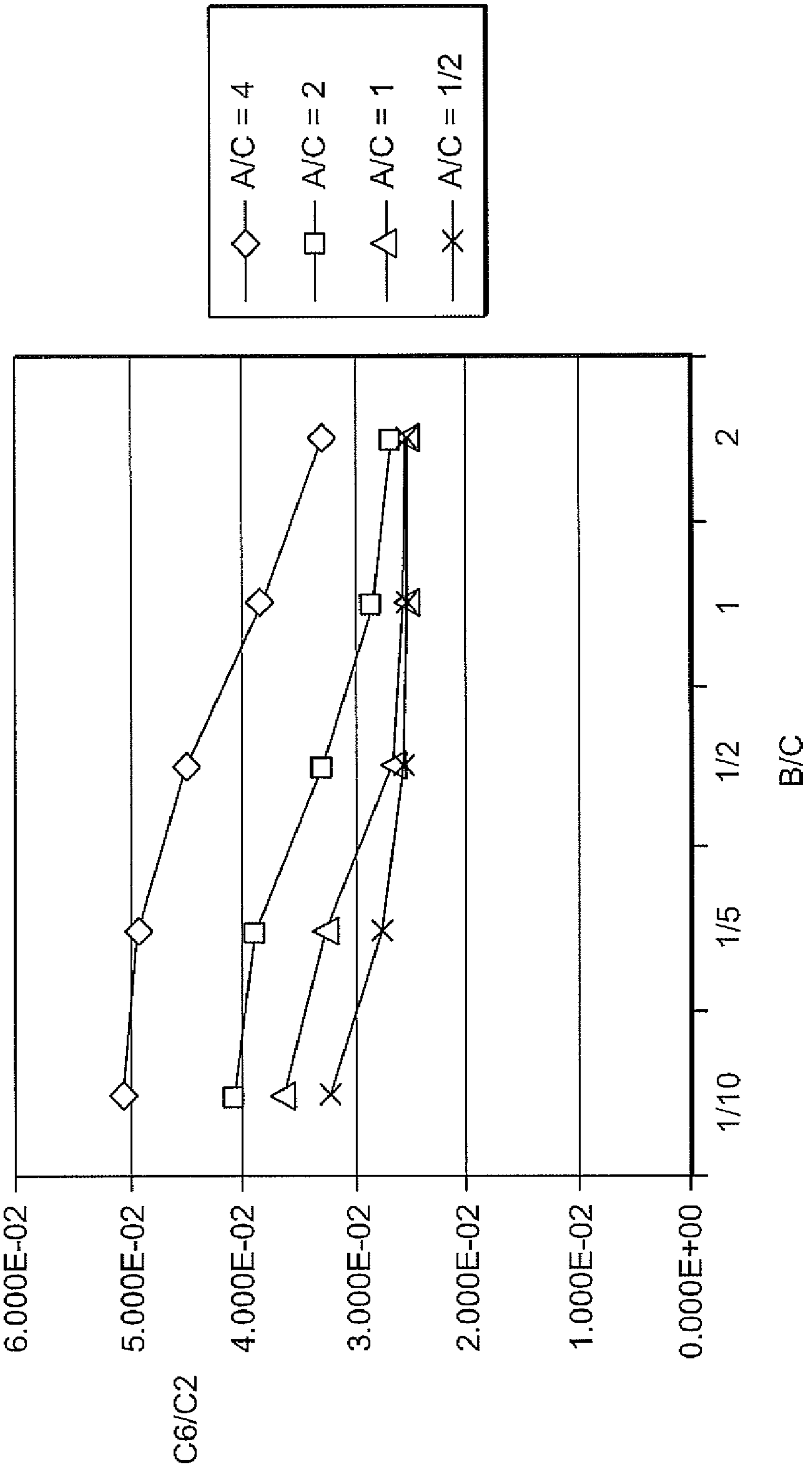
Figure 3C:
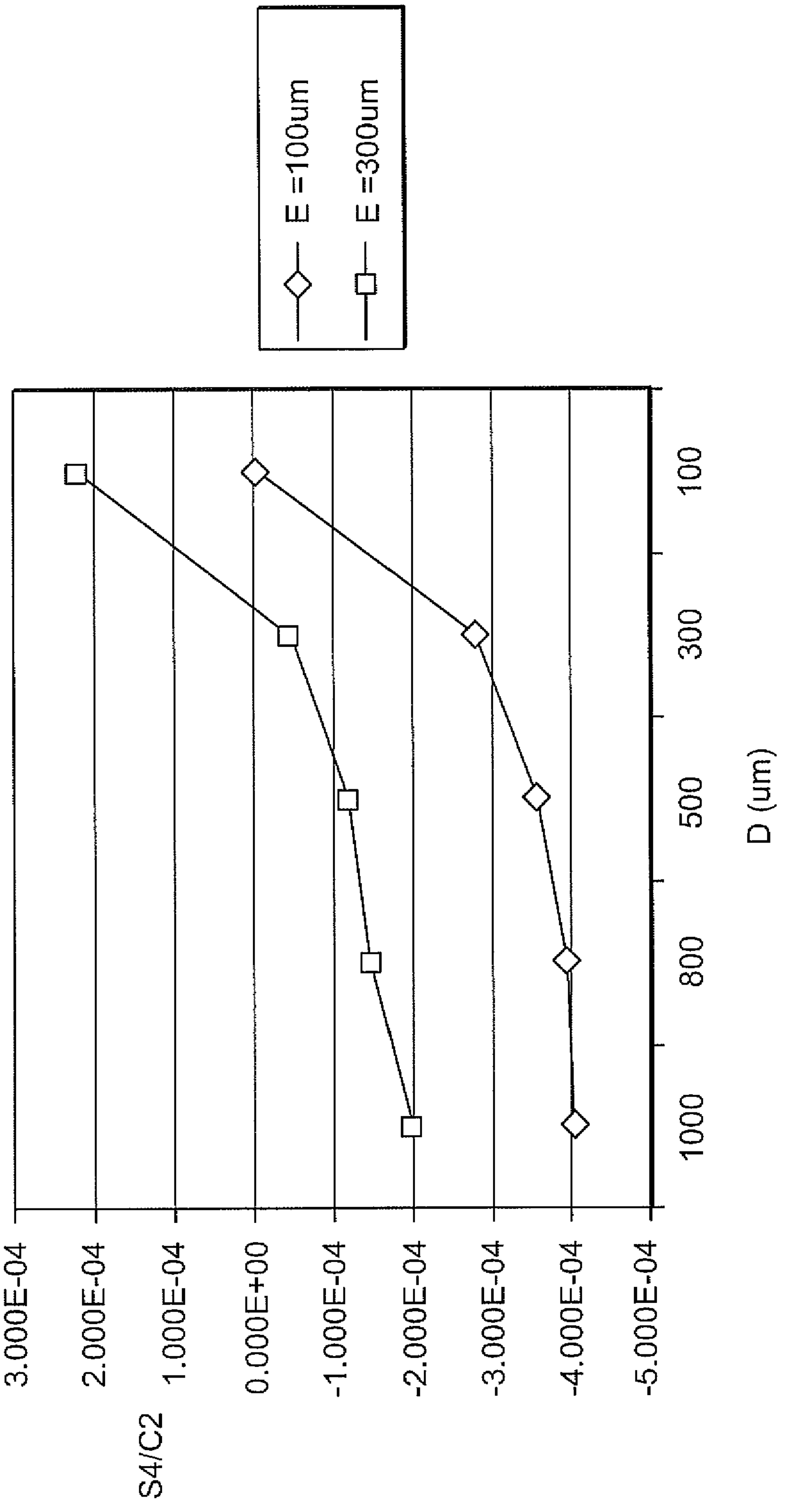
Figure 3D:
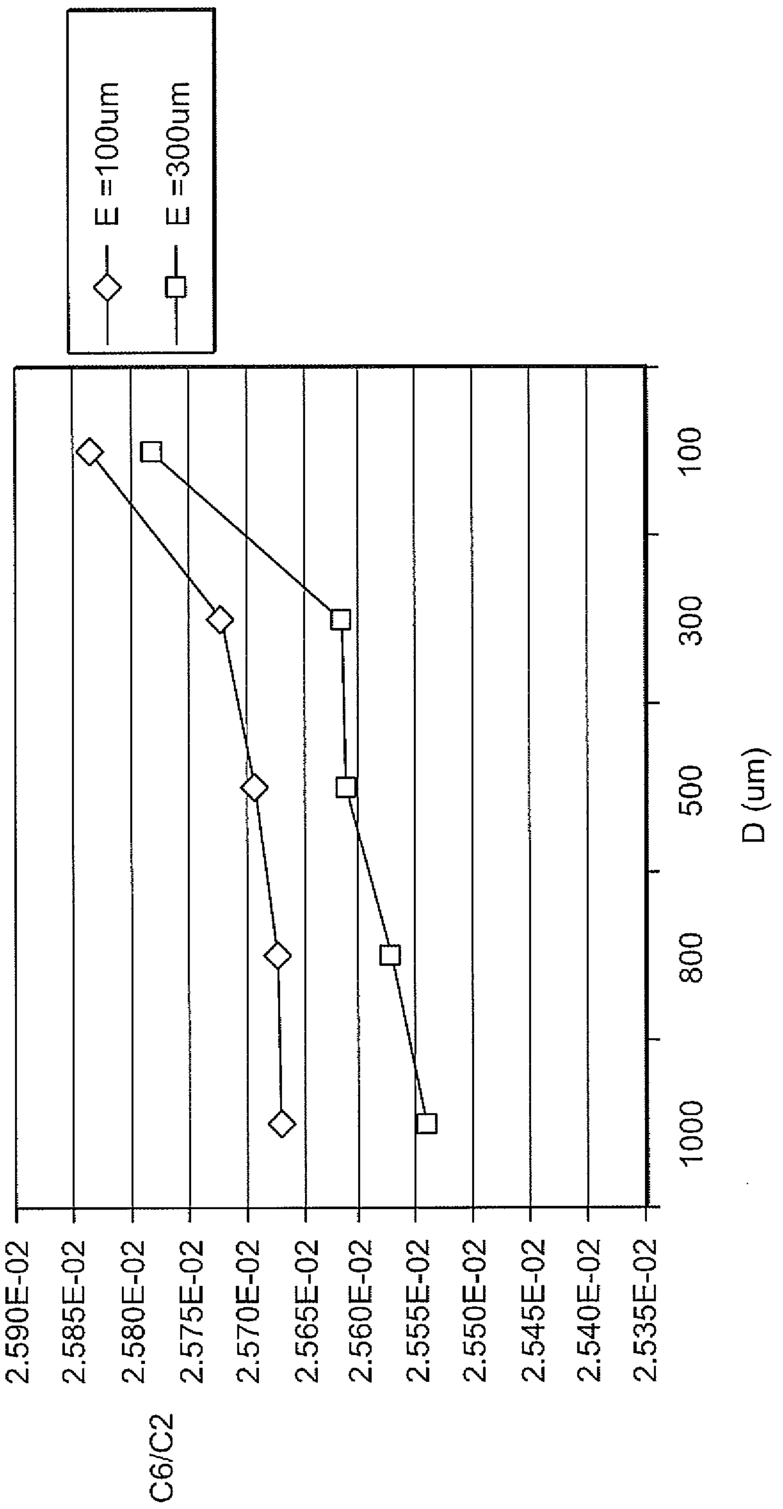

In simulations that excluded the housing, it is found that the coefficients $S_4$ and $C_6$ are minimized when the dimensions of the rectangular electrode (B or C) is equal to or greater than the dimension of the aperture (A) as shown in FIGS. 3A-3B. Choosing an optimized electrode geometry with A=B=C and including the housing, simulations show that the distances from the electrode surfaces to the surrounding housing (D and E) should be kept equal to minimize $S_4$, but at the expense of $C_6$ as shown in FIGS. 3C-3D. $C_6/C_2$ is a minimum when D is large as shown in FIG. 3D.

For fabrication and testing considerations, dimension A was set to 1 mm and E to 100 μm. A large device aperture will increase the signal strength of the transmitted ions, while a small electrode-to-housing distance will improve processing uniformity. Although these dimensions were chosen, dimension A, B and C can range from 50 μm to 5 mm while dimension D and E can range from 5 μm to 5 mm or larger.

Higher-order field contributions arising from geometric non-idealities lead to non-linear resonances. These resonances manifest as peak splitting that is typically observed in quadrupole mass spectra. Reported work involving linear quadrupoles operated in the second stability region show improved peak shape without these splits. It is believed that operating the device in the second stability region will provide a means to overcome the non-linear resonances introduced by the square electrode geometry.

FIGS. 4A-4G are schematic diagrams illustrating the process flow used in describing the fabrication of the inventive quadrupole mass filter 40. Five highly-doped silicon double-side polished (DSP) wafers are needed to complete the inventive filter device. Two 500±5 μm wafers are used as the capping layers 42, two 1000±10 μm wafers serve as the rectangular electrode layers 44, and another 1000±10 μm is utilized as a spacer layer 47. All the wafers initially have an oxide layer having a thickness of 0.3 μm to serve as a protective layer 48 during processing.

Figures 4A, 4B, 4C, 4D:
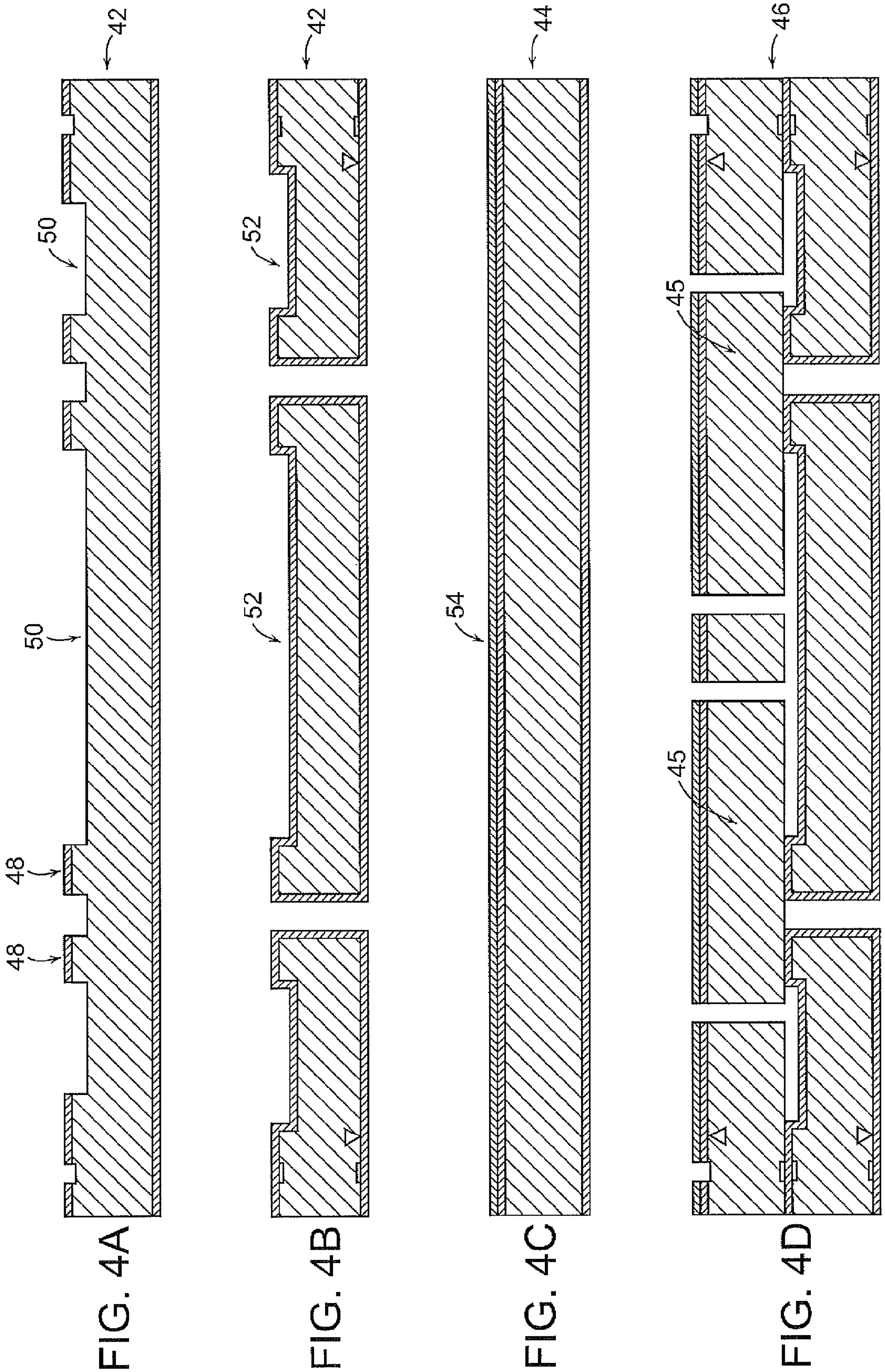
FIGS. 4A-4G is a process flowgraph illustrating the fabrication of the inventive quadrupole mass filter.
Figure 4E:
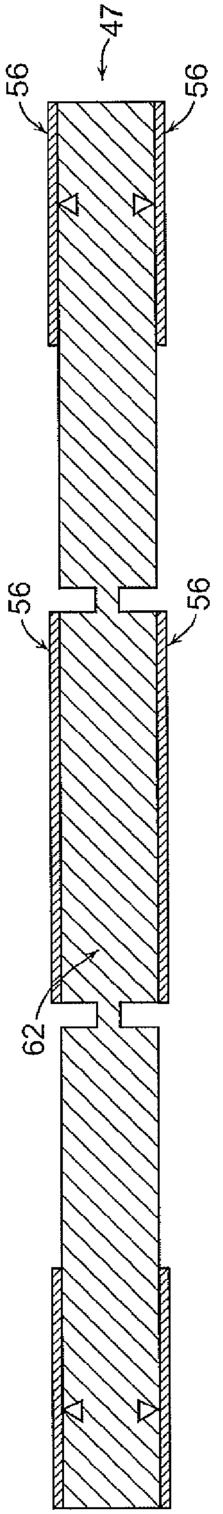
Figure 4F:
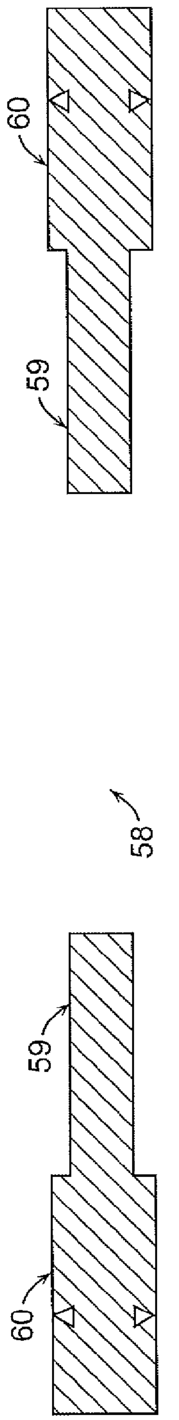
Figure 4G:
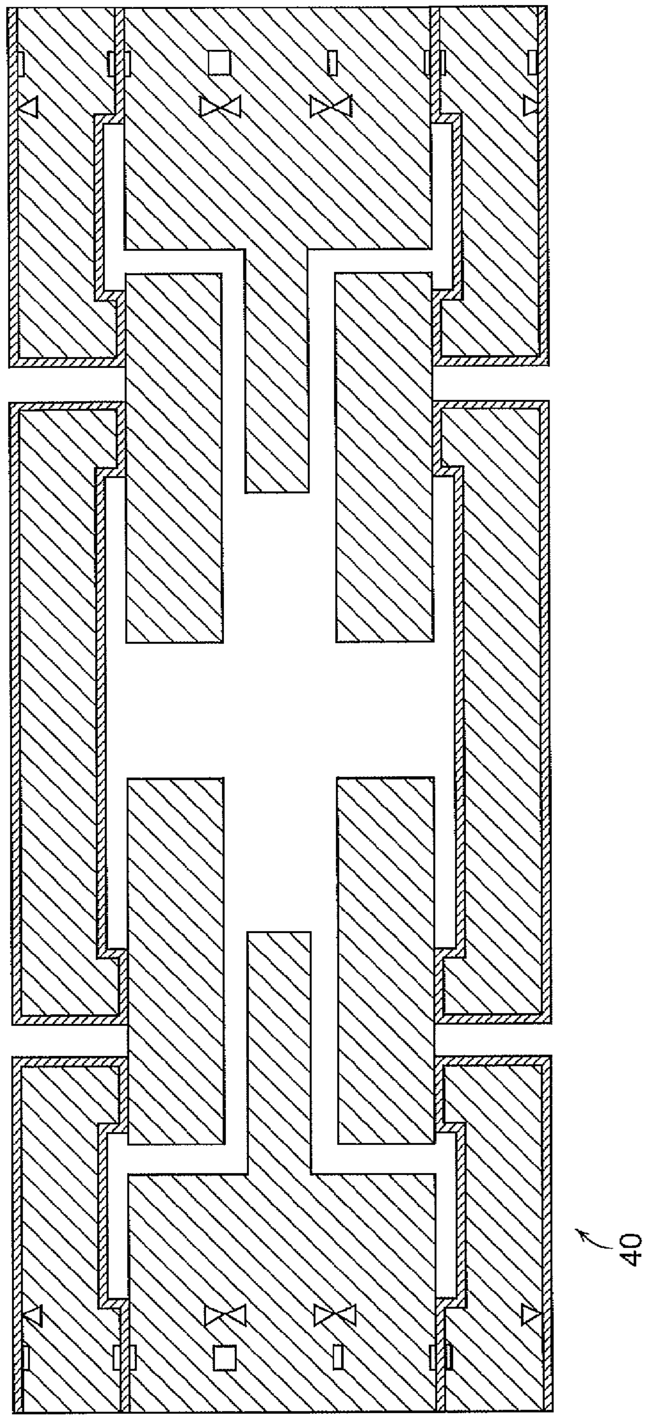

A series of deep reactive ion etches (DRIE), wet thermal oxidation, and silicon fusion bonding is used to realize the device. Each of the cap wafers 42 is defined with release trenches 50 100 μm deep that are required for the electrode etch as shown in FIG. 4A, and through-wafer vias for electrical contact. The cap wafers 42 then have 1 μm of thermal oxide 52 grown to serve as an electrical isolation barrier, as show in FIG. 4B. The electrode wafers 44 have 250 nm of silicon rich nitride 54 deposited on one side to serve as an oxide wet-etch barrier as shown as in FIG. 4C. The exposed oxide is removed with a buffered oxide etch (BOE) before bonding to the cap wafers 42 and annealing. The electrodes 45 are defined in the bonded stack 46 with a DRIE halo-etch, as shown in FIG. 4D, followed by nitride removal with hot phosphoric acid. The spacer wafers 47 are coated on both sides with 4 μm of plasma enhanced chemical vapor deposited (PECVD) silicon oxide 56 to serve as hard masks for a nested etch 62. On both sides, the PECVD oxide 56 is patterned with reactive ion etching (RIE), followed by DRIE of 450 μm to begin defining the aperture 58 as shown in FIG. 4E. The entire spacer wafer 47 is then etched 100 μm on each side, followed by an oxide strip 60 as shown in FIG. 4F. The nested etch 62 completes the aperture 58 and defines recesses 59 in the spacer wafer 47 which prevents electrical shorting in the final device. The thin protective oxide 48 on the cap-electrode stacks 46 are removed with BOE. The two stacks 46 and the spacer wafer 47 are then cleaned and fusion bonded, followed by die-sawing to complete the device 40 as shown in FIG. 4G.

There is evidence that a quadrupole mass filter (QMF) operated in a higher stability region results in the sharpening of the peak widths in the mass spectrum obtained. Artifacts inherent of non-idealities in the QMF geometry seem to be minimized or removed from the spectrum when operated in the higher stability region. This enhancement is due to the fact that ions are more susceptible to becoming unstable in the higher stability regions. Ions that are closer to the electrodes are the ones that experience the high-order field contributions more significantly, but are also the ones less likely to transmit. As a result, the effects of imperfections in the generated field are not as apparent, thus improving the spectrum but at the cost of transmission.

Figure 5:
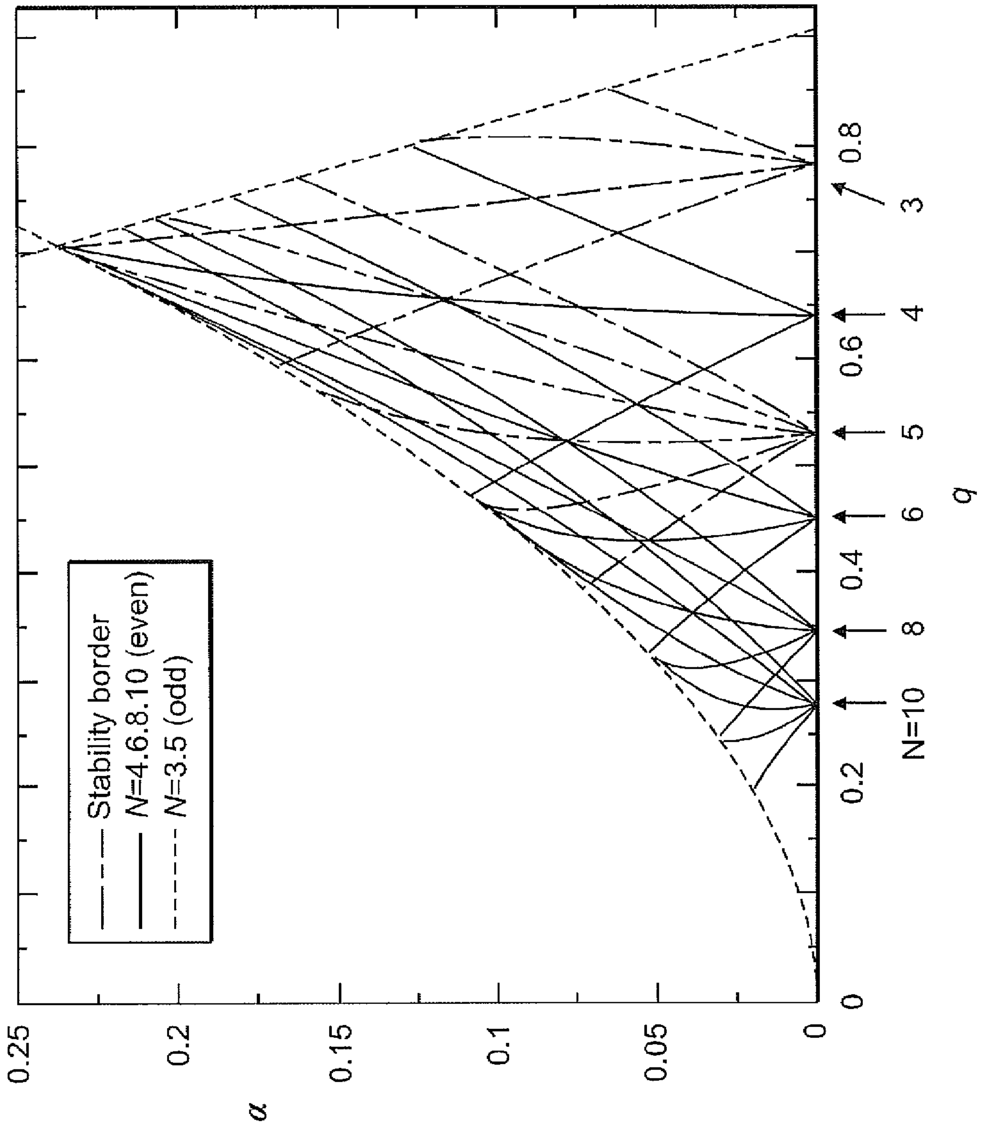
FIG. 5 is a graph illustrating the stability region I of the Mathieu stability diagram with instability boundaries from non-linear resonances.

The effects of geometric non-idealities on an ideal quadrupole field have been well studied for ion-traps. It was found that higher-order multipole field contributions arising from geometric non-idealities (electrode shape, alignment, etc.) cause non-linear resonances. These resonances result in instabilities within the standard Mathieu stability regions, as shown in FIG. 5. These instabilities manifest themselves as dips within the mass spectrum causing peak-splitting, thus limiting the resolution obtainable. By operating in the second stability region, the operating point is no longer at a point on the a-q plane where these instabilities converge. This gives better peak shape since the dips and peak-splitting will be minimized or removed.

Figure 6:
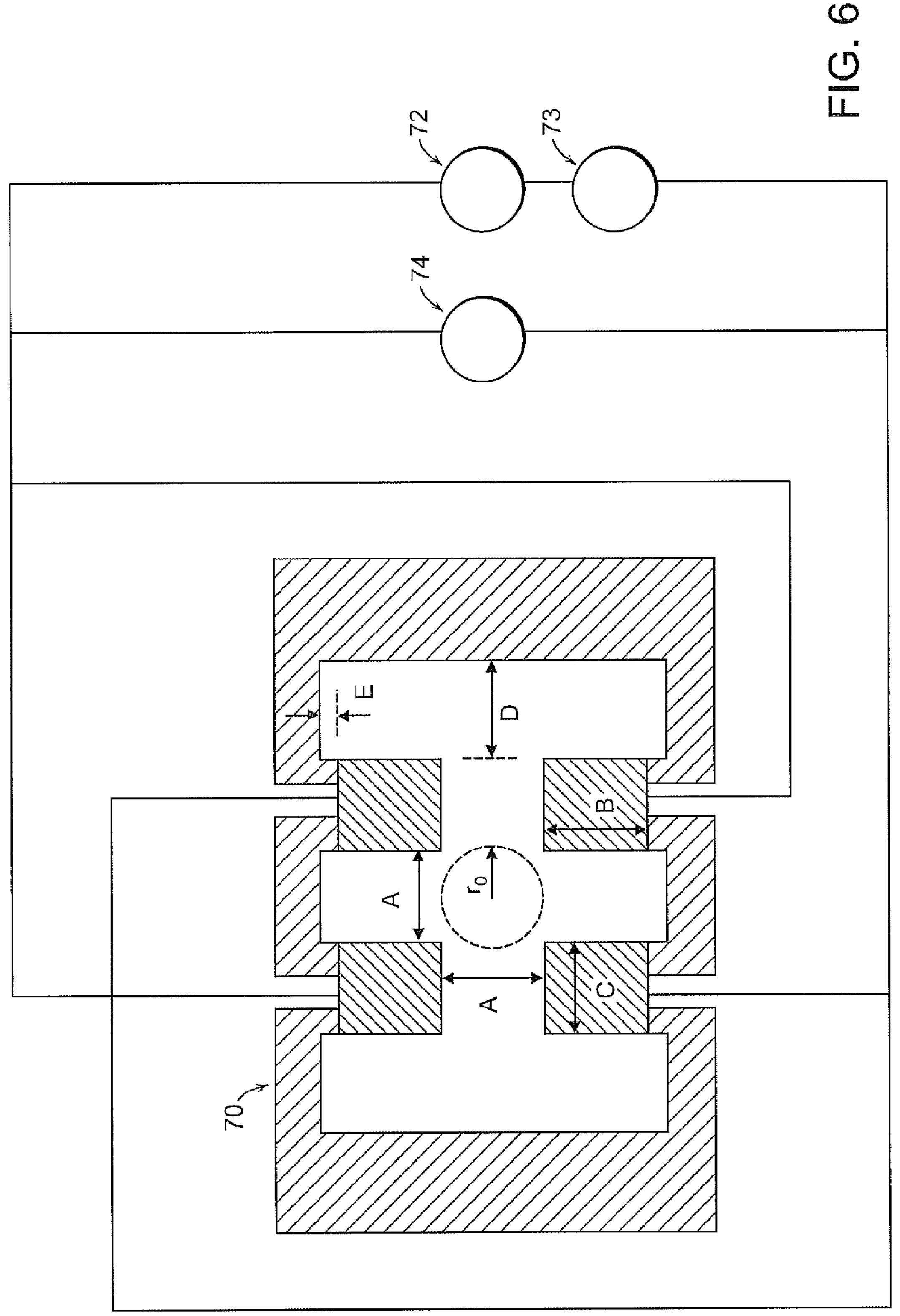
FIG. 6 is schematic diagram illustrating the modified drive configuration, it is using an auxiliary drive signal.
Figure 7A:
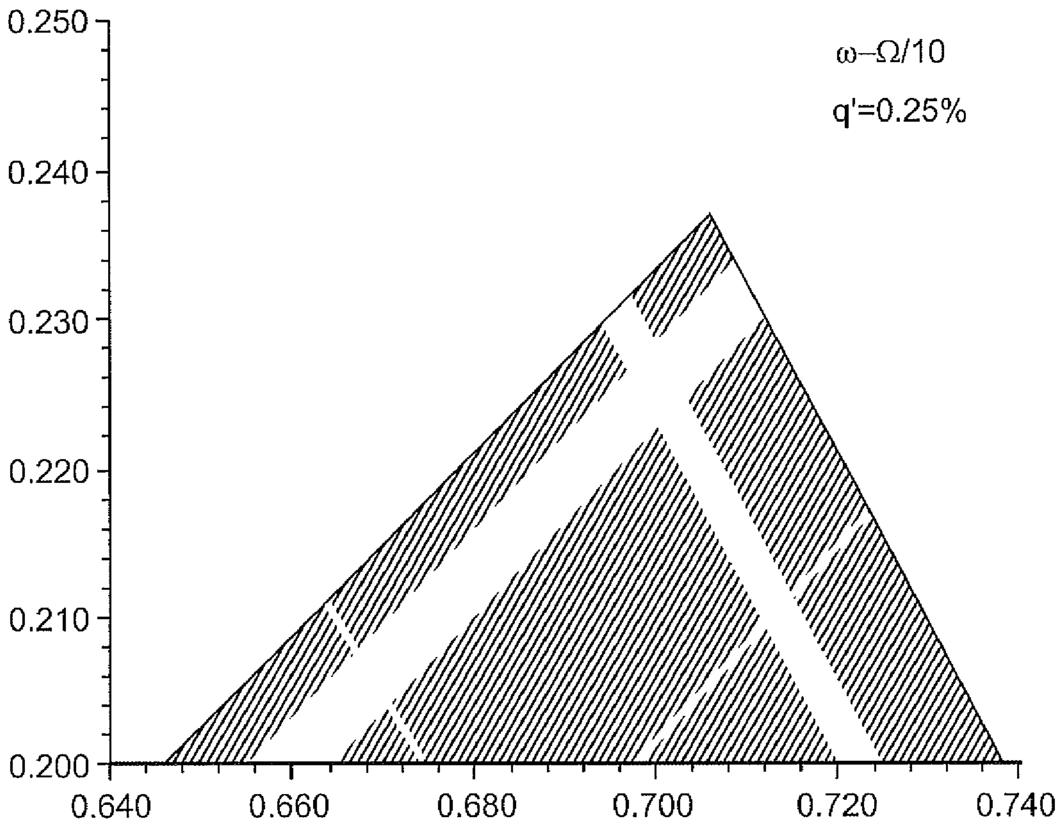
FIGS. 7A-7C are graphs illustrating stability islands within the first stability region due to different auxiliary drive signals.
Figure 7B:
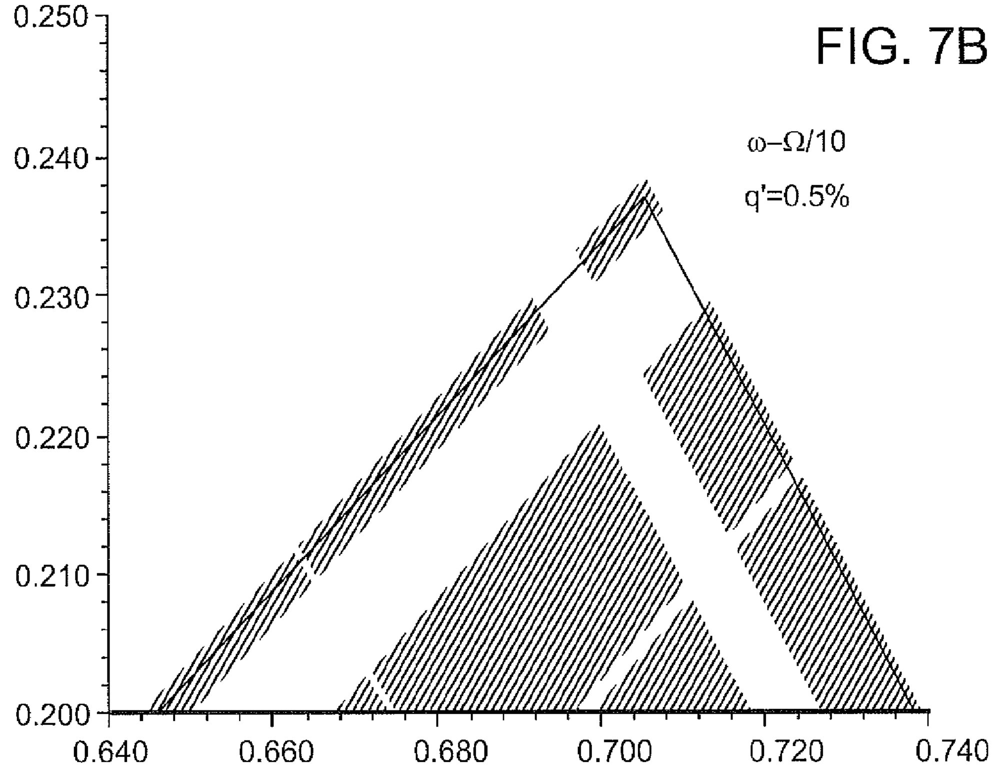
Figure 7C:
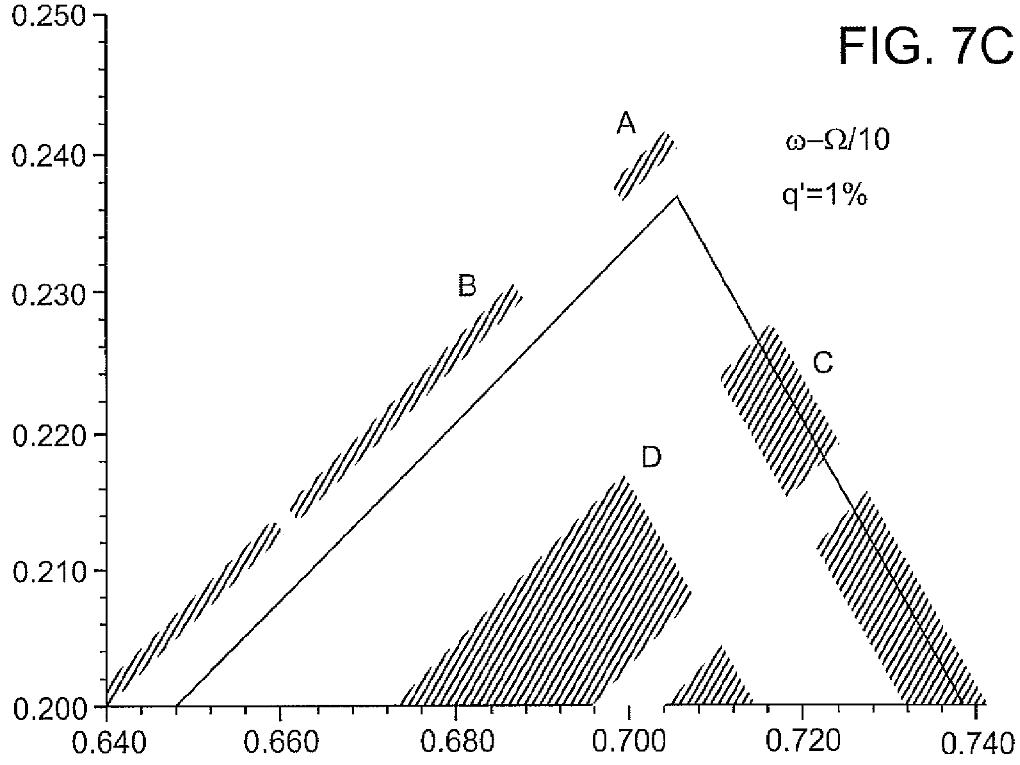

Other than operating in higher stability regions, it is possible to enhance performance with drive signal processing. FIG. 6 show a QMF 70 being connected to standard voltage sources 72 and 73, which provides the RF and DC voltage components respectively, and by applying an auxiliary drive signal provided by a voltage source 74 to the standard waveform used to generate quadrupole fields results in an interesting effect. Depending on the amplitude and the phase of the auxiliary signal, stability islands form within the standard Mathieu stability regions as shown in FIGS. 7A-7C. Standard quadrupoles operate at the apex of stability region I since the intersection of the scan-line and stability boundaries determines the resolution. With this form of signal processing, it is possible to create new stability boundaries with high-resolution around operating conditions where there are little to no higher-order resonances. Using such a technique has the potential to overcome many non-idealities.

The QMF 70 is identical to the QMF 2 described in FIG. 2 and uses the rectangular electrodes. However, other electrode can be used such as cylindrical rods. By using a fully electronic approach (driving signals and voltages to set operational points and create stability islands), enhancements are readily achievable and can be modified on the fly to accommodate any changes in a QMF.

The invention provides a fully microfabricated, mass-producible, MEMS linear quadrupole mass filter. A MEMS quadrupole with square electrodes can function as a mass filter without significant degradation in performance if driving in higher stability regions is possible. Successful implementation of such devices will lead into arrayed configurations for parallel analysis, and aligned quadrupoles operated in tandem for enhanced resolution.

Although the present invention has been shown and described with respect to several preferred embodiments thereof, various changes, omissions and additions to the form and detail thereof, may be made therein, without departing from the spirit and scope of the invention.

What is claimed is:

1. A quadrupole mass filter (QMF) comprising:

a plurality of rectangular shaped electrodes aligned in a symmetric manner to generate a quadrupole field;

an aperture region positioned in a center region parallel to and adjacent to each of said rectangular shaped electrodes, an incoming ion stream enters said aperture region so as to be controlled by said quadrupole field;

a housing unit having a hollow rectangular cross-section that encloses said QMF, the inner surfaces of the housing unit being parallel to said rectangular shaped electrodes;

a plurality of voltage sources providing a r.f. and d.c. signal to said rectangular shaped electrodes for generating said quadrupole field; and an auxiliary voltage source applying an auxiliary drive signal to said r.f. and d.c. signal to create new stability boundaries with high resolution within the standard Mathieu stability regions around operating conditions where there are approximately no higher-order resonances.

2. The QMF of claim 1, wherein said rectangular shaped electrodes are used for the purpose of ion optics, including but not limited to lenses, pre-filters, and post-filters, to improve device performance.

3. The QMF of claim 1, wherein the parameters of said rectangular shaped electrodes are optimized.

4. The QMF of claim 1, wherein the dimensions of said rectangular shaped electrodes are equal minimizes the first odd and even high-order components.

5. The QMF of claim 1, wherein the vertical and lateral distances between said rectangular shaped electrodes and said housing unit are equal so as to minimize high-order components.

6. The QMF of claim 1, wherein said rectangular electrodes have a separation distance between 50 μm and 5 mm.

7. The QMF of claim 1, wherein the distances between said rectangular shaped electrodes and said housing are between 5 μm and 5 mm or larger.

8. A method of forming a quadrupole mass filter (QMF) comprising:

forming a plurality of rectangular shaped electrodes aligned in a symmetric manner to generate a quadrupole field;

forming an aperture region positioned in a center region parallel to and adjacent to each of said rectangular shaped electrodes, an incoming ion stream enters said aperture region so as to be controlled by said quadrupole field;

forming a housing unit having a hollow rectangular cross-section that encloses said QMF, the inner surfaces of the housing unit being parallel to said rectangular shaped electrodes;

providing a plurality of voltage sources that provide a r.f. and d.c. signal to said rectangular shaped electrodes for generating said quadrupole field; and providing an auxiliary voltage source that applies an auxiliary drive signal to said r.f. and d.c. signal to create new stability boundaries with high resolution within the standard Mathieu stability regions around operating conditions where there are approximately no higher-order resonances.

9. The method of claim 8, wherein said rectangular shaped electrodes are used for the purpose of ion optics, including but not limited to lenses, pre-filters, and post-filters, to improve device performance.

10. The method of claim 8, wherein the parameters of said rectangular shaped electrodes are optimized.

11. The method of claim 8, wherein the dimensions of said rectangular shaped electrodes are equal minimizes the first odd and even high-order components.

12. The method of claim 8, wherein the vertical and lateral distances between said rectangular shaped electrodes and said housing unit are equal so as to minimize high-order components.

13. The method of claim 8, wherein said rectangular electrodes have a separation distance between 50 μm and 5 mm.

14. The method of claim 8, wherein the distances between said rectangular shaped electrodes and said housing are between 5 μm and 5 mm or larger.

15. A method of producing a quadrupole field comprising:

aligning a plurality of rectangular shaped electrodes in a symmetric manner to generate a quadrupole field;

positioning an aperture region in a center region parallel to and adjacent to each of said rectangular shaped electrodes, an incoming ion stream enters said aperture region so as to be controlled by said quadrupole field;

enclosing said QMF with a housing unit having a hollow rectangular cross-section, the inner surfaces of the housing unit being parallel to said rectangular shaped electrodes;

providing a r.f. and d.c. signal to said rectangular shaped electrodes for generating said quadrupole field; and applying an auxiliary drive signal to said r.f. and d.c. signal so as to create new stability boundaries with high resolution within the standard Mathieu stability regions around operating conditions where there are approximately no higher-order resonances.

16. The method of claim 15, wherein said rectangular shaped electrodes are used for the purpose of ion optics, including but not limited to lenses, pre-filters, and post-filters, to improve device performance.

17. The method of claim 15, wherein the parameters of said rectangular shaped electrodes are optimized.

18. The method of claim 15, wherein the dimensions of said rectangular shaped electrodes are equal minimizes the first odd and even high-order components.

19. The method of claim 15, wherein the vertical and lateral distances between said rectangular shaped electrodes and said housing unit are equal so as to minimize high-order components.

20. The method of claim 15, wherein said rectangular shaped electrodes have a separation distance between 50 μm and 5 mm.

21. The method of claim 15, wherein the distances between said rectangular shaped electrodes and said housing are between 5 μm and 5 mm or larger.

* * * * *